US008698564B2

(12) United States Patent
Kamiyama et al.

(10) Patent No.: US 8,698,564 B2
(45) Date of Patent: Apr. 15, 2014

(54) RADIO FREQUENCY AMPLIFIER CIRCUIT (75) Inventors: Tomohide Kamiyama, Osaka (JP); Hiroshi Naitou, Osaka (JP); Takashi Uno, Hyogo (JP); Motoyoshi Iwata, Osaka (JP); Kazuhiro Yahata, Osaka (JP); Hikaru Ikeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/695,629

(22) PCT Filed: Apr. 25, 2012

(86) PCT No.: PCT/JP2012/002841
§ 371 (c)(1),
(2), (4) Date: Nov. 1, 2012

(87) PCT Pub. No.: WO2012/160755
PCT Pub. Date: Nov. 29, 2012

(65) Prior Publication Data
US 2013/0106519 A1 May 2, 2013

(30) Foreign Application Priority Data

May 24, 2011 (JP) ................. 2011-116038

(51) Int. Cl.
*H03F 3/68* (2006.01)
(52) U.S. Cl.
USPC ....................... 330/295; 330/124 R
(58) Field of Classification Search
USPC .................. 330/295, 124 R, 84, 126, 302
See application file for complete search history.

(56) References Cited

U.S. PATENT DOCUMENTS

| 3,769,586 | A | * | 10/1973 | Shapiro et al. | ................ 455/129 |
| 5,955,926 | A | * | 9/1999 | Uda et al. | ...................... 330/295 |
| 6,759,908 | B2 | | 7/2004 | Gotou et al. | |
| 6,847,258 | B2 | * | 1/2005 | Ishida et al. | .............. 330/124 R |
| 7,170,353 | B2 | * | 1/2007 | Amano | ......................... 330/295 |
| 7,800,448 | B2 | * | 9/2010 | Blednov | ....................... 330/295 |

(Continued)

FOREIGN PATENT DOCUMENTS

| JP | 63-240110 | 10/1988 |
| JP | 02-260905 | 10/1990 |

(Continued)

OTHER PUBLICATIONS

International Search Report issued Jul. 31, 2012 in International (PCT) Application No. PCT/JP2012/002841.

*Primary Examiner* — Henry Choe
(74) *Attorney, Agent, or Firm* — Wenderoth, Lind & Ponack, LLP.

(57) ABSTRACT

A radio frequency amplifier circuit includes: low-output transistors, each of which includes an input terminal, an output terminal, and a ground terminal, and amplifies a radio frequency signal; a harmonic processing circuit provided for each of the low-output transistors to be connected to the output terminal of the low-output transistor, and processing a secondary harmonic included in an amplified radio frequency signal, and a resistor connected to the output terminal of each of the low-output transistors. The input terminal of each of the low-output transistors is connected to an input terminal of the radio frequency amplifier circuit via an inductor, and the output terminal of each of the low-output transistors is connected to the other output terminal via the resistance and is further connected to an output terminal of the radio frequency amplifier circuit via an inductor.

12 Claims, 7 Drawing Sheets

(56) References Cited

U.S. PATENT DOCUMENTS

| | | | |
|---|---|---|---|
| 8,022,769 B2 * | 9/2011 | Ng et al. | 330/295 |
| 8,354,882 B2 * | 1/2013 | Blednov | 330/124 R |
| 2002/0063603 A1 | 5/2002 | Gotou et al. | |
| 2005/0231286 A1 | 10/2005 | Gotou et al. | |

FOREIGN PATENT DOCUMENTS

| | | |
|---|---|---|
| JP | 04-129408 | 4/1992 |
| JP | 05-110355 | 4/1993 |
| JP | 07-183744 | 7/1995 |
| JP | 2738701 | 4/1998 |
| JP | 11-103205 | 4/1999 |
| JP | 2001-185966 | 7/2001 |
| JP | 2002-164753 | 6/2002 |
| JP | 2005-303771 | 10/2005 |
| JP | 2008-263439 | 10/2008 |
| JP | 2011-035761 | 2/2011 |

* cited by examiner

RADIO FREQUENCY AMPLIFIER CIRCUIT

TECHNICAL FIELD

The present invention relates to radio frequency amplifier circuits including harmonic processing circuits, and particularly to a radio frequency amplifier circuit including a class-F circuit.

BACKGROUND ART

Improvement in power added efficiency (PAE) of a radio frequency amplifier circuit directly relates to reduction in power consumption of a device. Accordingly, the PAE is a very important property. In a high-output amplifier circuit, supplied power is converted into heat due to power consumption and a low PAE. This makes a heat-release design be difficult and decreases reliability of a device.

Conventionally, in order to cause the radio frequency amplifier circuit to operate at high efficiency, a device which includes a class-F circuit and an inverse class-F circuit has been generally used. Accordingly, mechanisms of these high efficiency circuits are known. In the amplifier circuit, power loss causes the efficiency to decrease. In order to prevent this, it is necessary to adjust a voltage/current waveform at an output so as to form an optimal waveform. To be specific, it is required to reduce an area where a voltage waveform and a current waveform overlap. For example, when a transistor included in the amplifier circuit is biased to a class-B operation, only a fundamental and even harmonics exist in an output current waveform. Thus, to reduce the aforementioned area, it is sufficient to set the output voltage waveform to include only the fundamental and odd harmonics. In order to achieve the above, if the even harmonics are set to be in a short-circuited state and the odd harmonics are set to be in an open state when viewed from an output of the transistor, the efficiency reaches 100% theoretically. This is the class-F circuit. Conversely, the inverse class-F circuit is such that the even harmonics are in the open state and the odd harmonics are in the short-circuited state. The class-F circuit and the inverse class-F circuit are selectively used depending on an on-resistance and a bias condition of the transistor to be used.

Patent Literature 1 discloses a high-efficiency radio frequency amplifier circuit including the conventional class-F circuit.

Figure 7A:
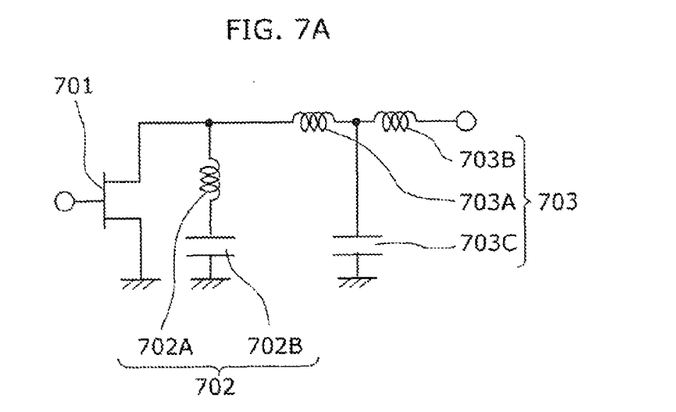
FIG. 7A is an analogous circuit which shows a configuration of a conventional radio frequency amplifier circuit.

FIG. 7A is an analogous circuit which shows a configuration of a conventional radio frequency amplifier circuit. The radio frequency amplifier circuit includes, as shown in FIG. 7A, a transistor 701, an inductor 702A having a lumped parameter element, a capacitor 702B, fundamental matching inductors 703A and 703B each of which has a lumped parameter element, and fundamental matching capacitor 703C having a lumped parameter element. In the circuit, a secondary harmonic processing circuit 702 including the inductor 702A and the capacitor 702B is connected to an output terminal of the transistor 701 in parallel, the fundamental matching inductors 703A and 703B are connected to the output terminal of the transistor 701 in series, and the fundamental matching capacitor 703C is connected between the fundamental matching inductors 703A and 703B in parallel. The above circuit configuration performs a secondary harmonic processing and improves the efficiency. Specifically, the inductor 702A and the capacitor 702B are set so that the secondary harmonic processing circuit 702 serving as a series resonant circuit resonates at a frequency twice as high as the fundamental, causing an impedance of the secondary harmonic processing circuit 702 to be 0 at a secondary harmonic. Accordingly, the secondary harmonic processing circuit 702 is in a short-circuited state for the output terminal of the transistor 701. Furthermore, the fundamental matching circuit 703 including the fundamental matching inductors 703A and 703B and the fundamental matching capacitor 703C is connected to the transistor 701.

Figure 7B:
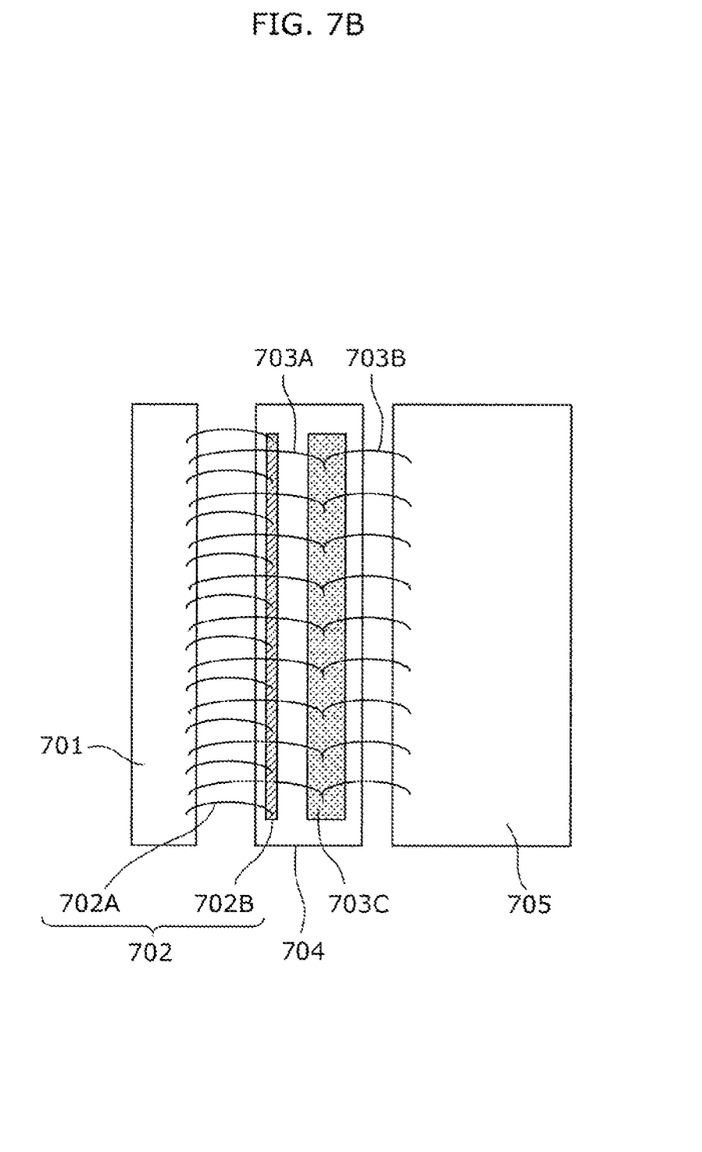
FIG. 7B is an example of a layout for achieving a conventional radio frequency amplifier circuit shown in FIG. 7A.

FIG. 7B is a diagram which shows an example of a layout for achieving the conventional radio frequency amplifier circuit shown in FIG. 7A. In order to achieve high output in the radio frequency amplifier circuit, low-output transistors are typically connected in parallel to obtain the high output. As shown in FIG. 7B, a plurality of output terminals (drain terminals) of the transistor 701 which are connected in parallel, and a capacitor 702B are connected by a plurality of wires corresponding to the respective inductors 702A included in the secondary harmonic processing circuit 702. Meanwhile, the output terminals of the transistor 701 and the capacitor 703C used for fundamental matching are connected by a plurality of wires corresponding to the respective inductors 703A included in the fundamental matching circuit 703. In addition, wires corresponding to the respective inductors 703B are formed for connecting the output terminals of the transistor 701 to an external circuit 705. The capacitor 702B and the fundamental matching capacitor 703C are patterned on a dielectric substrate 704.

Patent Literature 2 discloses a radio frequency amplifier circuit used for causing harmonic reflection quantity to relatively increase with respect to a fundamental. In the radio frequency circuit, a transistor is divided in units of cells to operate in parallel. Each of the divided transistor cells is connected, in an output-terminal side thereof, to a tertiary harmonic processing circuit, a secondary harmonic processing circuit, and an output-side fundamental matching in series. The plurality of output signal lines connected in series are combined into one in a power combining circuit. This achieves high efficiency in operation of a radio frequency amplifier circuit while variation of the harmonic load for each of the transistors is suppressed, in comparison with a case where the harmonic processing circuit is formed without dividing the transistor.

CITATION LIST

Patent Literature

[PTL 1] Japanese Patent No. 2738701
[PTL 2] Japanese Unexamined Patent Application Publication No. 2002-164753

SUMMARY OF INVENTION

Technical Problem

However, it is difficult to sufficiently increase efficiency in a high-output transistor in which output terminals of low-output transistors are short-circuited so as to connect the low-output transistors in parallel for increasing an output of the transistor, even if the technique in the Patent Literature 1 is, without any change, applied to the high-output transistor.

In addition, in a radio frequency amplifier circuit disclosed in Patent Literature 2, oscillation due to interference by an output signal is concerned.

In view of the above, an object of the present invention is to provide a radio frequency amplifier circuit which is stably operable with high efficiency.

Solution to Problem

In order to solve the above problem, a radio frequency amplifier circuit according to an aspect of the present invention includes: a plurality of first transistors, each of which includes an input terminal, an output terminal, and a ground terminal, and amplifies a radio frequency signal; an output-side harmonic processing circuit provided for each of the first transistors to be connected to the output terminal of the first transistor, the output-side harmonic processing circuit processing even harmonics or odd harmonics both included in the amplified radio frequency signal, thereby operating in a class-F mode or an inverse class-F mode; and an output-side resistor connected to the output terminal of each of the first transistors, in which the input terminal of each of the first transistors is connected to an input terminal of the radio frequency amplifier circuit via an input matching element, and the output terminal of each of the first transistors is connected to the output terminal of the other one of the first transistors via the output-side resistor, and is further connected to an output terminal of the radio frequency amplifier circuit via an output matching element.

Advantageous Effects of Invention

The present invention relates to a radio frequency amplifier circuit including a harmonic processing circuit. In the radio amplifier circuit, output terminals of low-output transistors are connected via a resistor, and the harmonic processing circuit which has an impedance to be ideally short-circuited in a high frequency is connected to each of the low-output transistors. This enables the harmonic processing for the class-F operation or the inverse class-F operation with high efficiency and stability.

DESCRIPTION OF EMBODIMENTS

[Knowledge which Forms the Basis of the Present Invention]

The inventors of the present invention have found that below shown problems might arise with respect to a radio frequency amplifier circuit described in a column of "Background Art".

In the conventional radio frequency amplifier circuit shown in FIG. 7B, a plurality of low-output transistors are connected in parallel to cause the radio frequency amplifier circuit to operate in such a manner that capacitors are equivalently connected in parallel. This decreases an output impedance of an entire transistor. Here, the output impedance is represented by S22 obtained by measuring an S parameter, and becomes a complex number expressed by an equation of $S22=Re \pm iIm$. Even if a resonant circuit in which the secondary harmonic is shorted-circuited, as a class-F operation, for example, to an output of the transistor having such a low-output impedance, the impedance is not sufficiently decreased relatively. Accordingly, the resonant circuit has a limited function as a short circuit, which surely incurs loss of the connected resonant circuit. For this reason, the high efficiency cannot always be achieved. In order to improve the above, it is necessary to significantly and relatively decrease the impedance of the resonant circuit below the output impedance of the transistor. Ideally, it is necessary to achieve a complete short-circuited state which is represented by $(0+j0)\Omega$. In order to make a real part be 0 in particular, a lossless inductor 702A or capacitor 702B is required to be achieved. However, this is unrealistic.

Each of the output terminals of the low-output transistors is connected to a capacitor 702B which is included in the harmonic processing circuit via the corresponding one of inductors 702A. Here, connection points of the inductors 702A and the capacitor 702B are different from each other, according to the low-output transistor. This means that electrical lengths from the low-output transistors to the harmonic processing circuit are different from each other depending on the low-output transistor. Accordingly, a harmonic processing circuit has various phases, and is not uniformly functioned when viewed from each of the low-output transistors. For this reason, an effect to obtain the high output by connecting the respective output transistors in parallel cannot be sufficiently obtained.

The electrical lengths can be unified in the radio frequency amplifier circuit disclosed in Patent Literature 2. However, in the radio frequency amplifier circuit, a plurality of output signal paths exist, such as transistor cells, a tertiary harmonic processing circuit, a secondary harmonic processing circuit, and an output fundamental matching circuit, and are independent of each other before processing in the power combining circuit. This brings an issue of concern that an unnecessary current loop is formed between the signal paths, and causes oscillation due to interfere by an output signal.

In order to solve the above problems, a radio frequency amplifier circuit according to an aspect of the present invention includes: a plurality of first transistors, each of which includes an input terminal, an output terminal, and a ground terminal, and amplifies a radio frequency signal; an output-side harmonic processing circuit provided for each of the first transistors to be connected to the output terminal of the first transistor, the output-side harmonic processing circuit processing even harmonics or odd harmonics both included in the amplified radio frequency signal, thereby operating in a class-F mode or an inverse class-F mode; and an output-side resistor connected to the output terminal of each of the first transistors, in which the input terminal of each of the first transistors is connected to an input terminal of the radio frequency amplifier circuit via an input matching element, and the output terminal of each of the first transistors is connected to the output terminal of the other one of the first transistors via the output-side resistor, and is further connected to an output terminal of the radio frequency amplifier circuit via an output matching element.

According to the aspect, isolation between the first transistors can be enhanced by connecting the output terminals of the first transistors via the resistor, in comparison with a conventional configuration in which the output terminals of the first transistors are short-circuited. Therefore, each of the first transistors can keep a high output impedance.

The output-side harmonic processing circuit is connected to the output terminal of each of the transistors, resulting in a difference between an output impedance higher than that in the conventional technique and a low impedance of the output-side harmonic processing circuit in even harmonics or odd harmonics. The difference allows a harmonic processing function of the output-side harmonic processing circuit to be efficiently exercised, thereby enabling the high efficiency of the radio frequency amplifier circuit.

In comparison with the conventional configuration in which the output terminals of the first transistors are not connected to each other, formation of an unnecessary current loop which may provoke oscillation can be avoided in signal paths, such as, the first transistor, the output-side harmonic processing circuit, and the output-side matching circuit.

This enables the harmonic processing for the class-F operation or the inverse class-F operation with high efficiency and stability.

If the output-side harmonic processing circuit is operated in the class-F, the output-side harmonic processing circuit is in the short-circuited state in a secondary harmonic and more even-order harmonic. If the output-side harmonic processing circuit is operated in the inverse class-F, the output-side harmonic processing circuit is in the short in a tertiary harmonic and more odd-order harmonic.

Furthermore, an impedance of each of output-side resistors which include the output-side resistor in a frequency band of the radio frequency signal is, for example, higher than a real part of an output impedance of each of the first transistors which are connected in parallel to each other not via the output-side resistor.

This can appropriately enhance the isolation between the first transistors, in comparison with the conventional configuration in which the output terminals of the first transistors are short-circuited.

Furthermore, each of output-side harmonic processing circuits which include the output-side harmonic processing circuit may include: a first inductor which has a first end connected to the output terminal of the first transistor: and a first capacitor which has a first end connected to a second end of the first inductor, and a second end grounded, and the output-side harmonic processing circuit may be a series resonant circuit which resonates at a frequency twice as high as a fundamental frequency of each of the first transistors.

With this configuration, each of the output-side harmonic circuits works as the series resonant circuit which includes the first inductor and the first capacitor, and shows the short-circuited state for the secondary harmonic. The output-side harmonic processing circuit is provided for each of the first transistors, so that the difference between the output impedance of the first transistors at the frequency of the secondary harmonic and the impedance of the output-side harmonic processing circuit can be secured, thereby achieving the high efficient class-F operation in the radio frequency circuit.

Furthermore, the radio frequency amplifier circuit may further include an output-side fundamental matching circuit connected to the output terminal of the first transistor and the output-side harmonic processing circuit, the output-side fundamental matching circuit selectively passing a fundamental included in the amplified radio frequency signal, in which the output-side fundamental matching circuit may include: second inductors, each of which serves as the output matching element, and has a first end connected to the output terminal of the first transistor and a second end connected to the second end of another second inductor; and a second capacitor which has a first end connected to every second end of the second inductors, and a second end grounded.

With this configuration, the fundamental of the radio frequency signal amplified by the first transistors is selectively passed, and the amplified radio frequency signal can be efficiently supplied to an external circuit to which the radio frequency signal is to be supplied.

Furthermore, the first transistors and output-side resistors including the output-side resistor may be formed on a single chip, and output-side harmonic processing circuits including the output-side harmonic processing circuit may be mounted inside a package in which the chip is mounted.

With this configuration, a mounting process and the like can be simplified.

Furthermore, the radio frequency amplifier circuit may further include: an input-side harmonic processing circuit which is provided for each of the first transistors to be connected to the input terminal of the first transistor, the input-side harmonic processing circuit processing the even harmonics or the odd harmonics both included in the amplified radio frequency signal, thereby operating in the class-F mode or the inverse class-F mode; and an input-side resistor connected to the input terminal of each of the first transistors, in which the input terminal of each of the first transistors may be connected to the input terminal of the other one of the first transistors via the input-side resistor.

The harmonic processing technique is used for controlling a voltage/current waveform of the output. Accordingly, the harmonic processing circuit is typically provided in an output side. With this configuration, the harmonic processing is performed both in the input side and the output side, thereby achieving a higher efficiency.

If the input-side harmonic processing circuit is operated in the class-F, the input-side harmonic processing circuit is in the short-circuited state in the secondary harmonic and the more even-order harmonic, as in the case for the output-side harmonic processing circuit. If the input-side harmonic processing circuit is operated in the inverse class-F, the input-side harmonic processing circuit is in the short-circuited state in the tertiary harmonic and the more odd-harmonic. Alternatively, the impedance in the input side can be adjusted so as to be a desired impedance in the output side.

An impedance of each of input-side resistors which include the input-side resistor in a frequency band of the radio frequency signal is higher than an input impedance of each of the first transistors which are connected in parallel to each other.

Compared with the conventional configuration in which input terminals of the first transistors are short-circuited to each other, the isolation between the first transistors can be appropriately enhanced.

Furthermore, each of input-side harmonic processing circuits which include the input-side harmonic processing circuit may include: a third inductor which has a first end connected to the input terminal of the first transistor; and a third capacitor which has a first end connected to a second end of the third inductor, and a second end grounded, and the input-side harmonic processing circuit may be a series resonant circuit which resonates at a frequency twice as high as a fundamental frequency of each of the first transistors.

With this configuration, each of the input-side harmonic processing circuits becomes the series resonant circuit including the third inductor and the third capacitor, and shows the short-circuited state for the secondary harmonic. The input-side harmonic processing circuit is provided for each of the first transistors. Therefore, difference between the input impedance of the first transistors at the frequency of the secondary harmonic and the impedance of the input-side harmonic processing circuit is secured, thereby achieving the high-efficient class-F operation in the radio frequency amplifier circuit.

Furthermore, the radio frequency amplifier circuit may further include an input-side fundamental matching circuit connected to the input terminal of the first transistor and the input-side harmonic processing circuit, the input-side fundamental matching circuit selectively passing a fundamental included in the amplified radio frequency signal, in which the input-side fundamental matching circuit may include: fourth inductors, each of which serves as the input matching element, and has a first end connected to the input terminal of the first transistor, and a second end connected to the second end of another fourth inductor; and a fourth capacitor which has a first end connected to every second end of the fourth inductors, and a second end grounded.

With this configuration, the fundamental of the radio frequency signal amplified in the first transistors can be selectively passed, and the radio frequency signal can be efficiently supplied from the external circuit from which the radio frequency signal is supplied.

Furthermore, input-side resistors including the input-side resistor, the first transistors, and output-side resistors including the output-side resistor may be formed on a single chip, and input-side harmonic processing circuits including the input-side harmonic processing circuit and output-side harmonic processing circuits including the output-side harmonic processing circuit may be mounted inside a package in which the chip is mounted.

With this configuration, a mounting process and the like can be simplified.

Furthermore, the radio frequency amplifier circuit may further include: a plurality of second transistors, each of which includes an input terminal, an output terminal, and a ground terminal, and amplifies the harmonic signal, in which the input terminal of each of the second transistors may be connected to the input terminal of the radio frequency amplifier circuit via the input matching element, and the output terminal of each of the second transistors may be connected to the output terminal of the radio frequency amplifier circuit via the output matching element, and may further be short-circuited to the output terminal of an adjacent one of the first transistors.

With this configuration, it is assumed to be difficult that the resistor is provided for the output terminal of the each of the transistors, depending on a size of each of the first and second transistors. In such a case, a single resistor can be connected to a set of the parallel-connected first and second transistors.

Compared with a case where a resistor is connected to an output terminal of each of the transistors, efficiency-improvement effect may slightly decreases in this configuration. However, this configuration has an advantage in the efficiency improvement over a conventional configuration in which transistors are connected not via resistor.

Furthermore, the second transistors, the first transistors, and output-side resistors including the output-side resistor may be formed on a single chip, and output-side harmonic processing circuits including the output-side harmonic processing circuit may be mounted in a package in which a chip is mounted.

With this configuration, a mounting process and the like can be simplified.

Hereinafter, the radio frequency amplifier circuit according to an embodiment of the present invention is described with reference to drawings. The same structural components are allocated by a single reference in the following drawings.

It should be noted that the embodiments described below each represent preferred embodiments of the present invention. A numeral value, a shape, a material, a component, an arrangement position and connection condition of the components, and the like described in the embodiments are merely examples, and are not intended to limit the present invention. The component which is not defined in an independent claim representing the broadest concept of the present invention is described as an arbitrary component which constitutes a more preferred embodiment.

[Embodiment 1]

Figure 1:
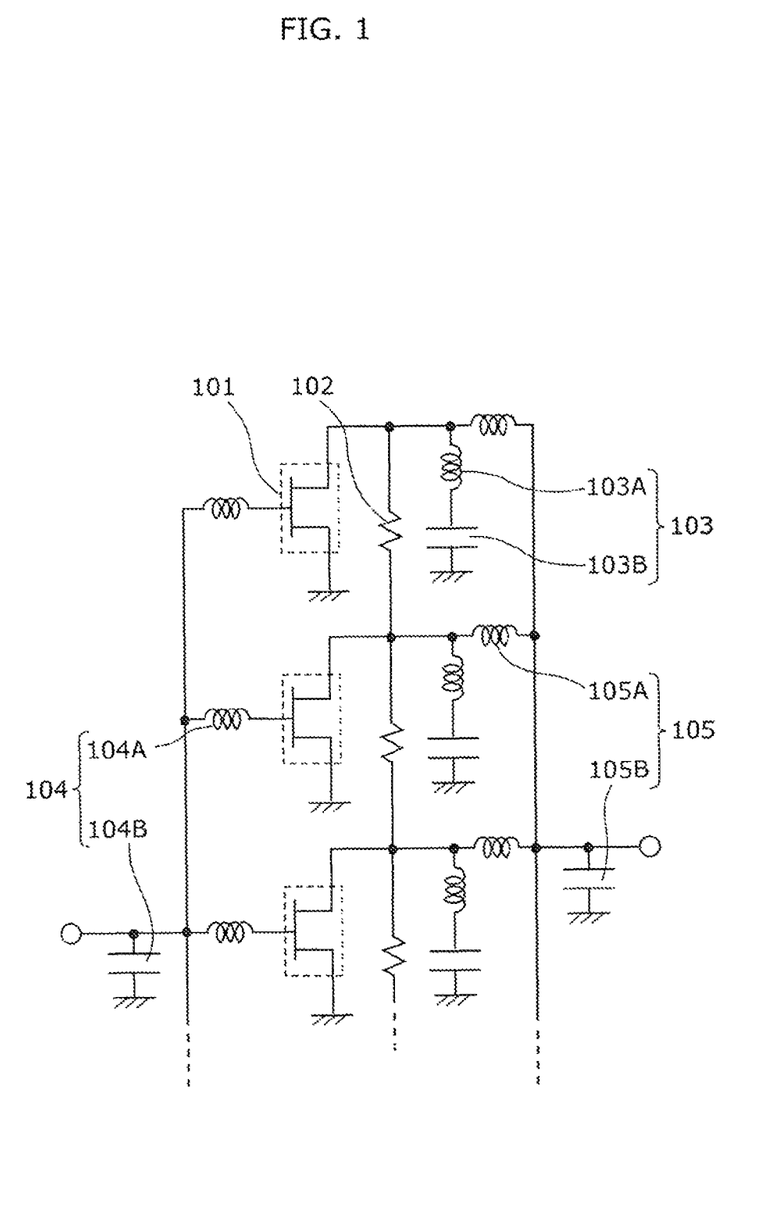
FIG. 1 is a circuit diagram which shows a radio frequency amplifier circuit according to Embodiment 1 of the present invention.

FIG. 1 is a circuit diagram which shows a radio frequency amplifier circuit according to Embodiment 1 of the present invention. The radio frequency amplifier circuit shown in FIG. 1 includes a plurality of low-output transistors 101 arranged in parallel, a resistor 102 disposed between drain output terminals of adjacent low-output transistors, a harmonic processing circuit 103 connected to each of the output terminals of the low-output transistors 101, an input-side fundamental matching circuit 104, and an output-side fundamental matching unit 105.

Each of the low-output transistors 101 is a first transistor which has a narrow gate width Wg, and outputs an amplified radio frequency signal. The amplified radio frequency signal passes through the output fundamental matching circuit 105, and is collected to be a high output. The high output is supplied from an output terminal of the radio frequency amplifier circuit.

The resistor 102 is an output-side resistor which connects one of the drain output terminals of the low-output transistors 101 to another one of the output terminals of the low-output transistors 101. The arrangement of the resistor 102 enhances isolation between the low-output transistors 101 in comparison with a case where the drain output terminals of the low-output transistors 101 are short-circuited with each other. Accordingly, an output impedance of each of the low-output transistors 101 can be kept at a high level. Compared also with a case where the drain output terminals of the low-output transistors 101 are not connected to each other, formation of an unnecessary electric loop which may provoke oscillation can be avoided in signal paths, such as the low-output transistors 101, the harmonic processing circuit 103, and the output-side fundamental matching circuit 105.

A plurality of harmonic processing circuits 103 are arranged in parallel to each other, and each of which serves as an output-side harmonic processing circuit which can process a secondary harmonic included in a radio frequency signal. Each of the harmonic processing circuits 103 serves as a processing circuit which shows a short-circuited state for the secondary harmonic.

Each of the harmonic processing circuits 103 includes an inductor 103A and a capacitor 103B which are connected in series. The inductor 103A which serves as a first inductor has one end connected to one of the drain output terminals of the low-output transistors 101, and the other end connected to one end of a capacitor 103B which serves as a first capacitor. The other end of the capacitor 103B is grounded. The inductor 103A and the capacitor 103B constitute a series resonant circuit which resonates at a frequency of the secondary harmonic and shows the short sate.

In the above configuration, the resistor 102 is formed between the drain output terminals of the low-output transistors 101, thereby keeping the output impedance of each of the low-output transistors 101. In addition, the harmonic processing circuit 103 which falls in the short-circuited state at the frequency of the secondary harmonic is provided for each of the low-output transistors 101. Accordingly, a difference between the output impedance of each of the low-output transistors 101 and an impedance of the harmonic processing circuit 103 at the frequency of the secondary harmonic can be ensured, so that a harmonic processing function of the harmonic processing circuit 103 is efficiently exercised. As a result, a high efficient class-F operation can be achieved in the radio frequency amplifier circuit.

The input-side fundamental matching circuit 104 includes an inductor 104A which serves as an input matching element provided for each of the low-output transistors 101, and a capacitor 104B shared by the low-output transistors 101. The inductor 104A which serves as a fourth inductor has one end connected to a gate of one of the low-output transistors 101, and the other end connected to an input terminal of the radio frequency amplifier circuit. In other words, gate input terminals of the low-output transistors 101 are connected to each other via the inductor 104A. The capacitor 104B which serves as a fourth capacitor has one end connected to the input terminal of the radio frequency amplifier circuit, and the other end grounded.

The input-side fundamental matching circuit 104 is a matching circuit matched with the low-output transistor 101 so as to cause a fundamental in an input signal to selectively pass through the low-output transistors 101.

The output-side fundamental matching circuit 105 includes an inductor 105A provided for each of the low-output transistors 101 and a capacitor 105B shared by the low-output transistors 101. The inductor 105A which serves as a second inductor includes one end connected to one of drain output terminals of the low-output transistors 101, and the other end connected to the output terminal of the radio frequency amplifier circuit. In other words, the drain output terminals of the low-output transistors 101 are connected to each other via the inductor 105A. The capacitor 105B which serves as a second capacitor has one end connected to the output terminal of the radio frequency amplifier circuit, and the other end grounded.

The output-side fundamental matching circuit 105 is connected to a subsequent stage of the harmonic processing circuit 103, and serves as a matching circuit which causes the fundamental included in the radio frequency signal amplified in the low-output transistor 101 to selectively be forwarded toward the output terminal of the radio frequency amplifier circuit.

The capacitors 104B and 105B are shared by all of the low-output transistors 101. The input-side fundamental matching circuit 104 causes an input signal to split to each of the low-output transistors 101, while the output-side fundamental matching circuit 105 combines the signal supplied from each of the low-output transistor 101. Although FIG. 1 shows three low-output transistors 101 are connected in parallel, the same configuration can be achieved with four or more stages of the low-output transistors 101. Although the input-side fundamental matching circuit 104 and the output-side fundamental matching circuit 105 are arranged in the first stage of an inductance-capacitance (LC), for example, these are not limited to be arranged at the first stage.

A harmonic processing circuit 103 which includes a distributed constant element for performing processing on a secondary harmonic can be used. However, the distributed constant element brings disadvantages for miniaturizing the harmonic processing circuit 103. Accordingly, the output-side harmonic processing circuit 103 as shown in FIG. 1 is used.

An effect which is obtained by adjusting a waveform decrease efficiency of the amplifier circuit, as an order of the harmonic increases. Meanwhile, arrangement of a high-order harmonic processing circuit affects on the secondary harmonic processing circuit. This complicates a circuit configuration of the harmonic processing circuit, causing miniaturization and cost-reduction of the amplifier circuit to be difficult. In view of the above, the radio frequency amplifier circuit shown in FIG. 1 is configured, taking the processing of the secondary harmonic into account.

Furthermore, the harmonic processing circuit 103 forms a class-F circuit which falls in the short-circuited state by the secondary harmonic. However, an inverse class-F circuit which becomes in an open state by the secondary harmonic can be formed.

A constituent material of the low-output transistors 101 is not limited to silicon (Si), gallium arsenide (GaAs), gallium nitride (GaN), and so on, nor limited to specific types of transistors such as a bipolar transistor and a field effect transistor. Furthermore, each of the low-output transistors 101 may be formed by mounting a plurality of individual discrete components.

Figure 2:
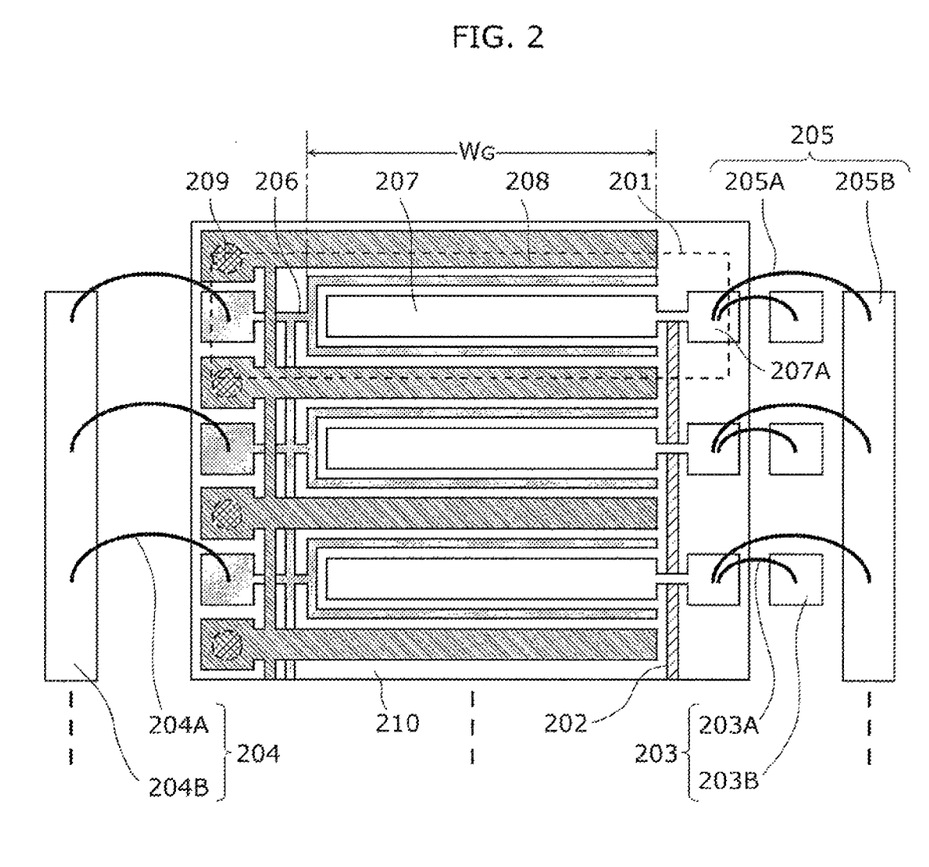
FIG. 2 is a layout which shows the radio frequency amplifier circuit according to Embodiment 1 of the present invention.

FIG. 2 is a layout which shows the radio frequency amplifier circuit according to Embodiment 1 of the present invention. In FIG. 2, an area surrounded by a broken line is a low-output transistor 201 which corresponds to one of the low-output transistors 101 in the circuit diagram shown in FIG. 1. A resistor 202 corresponds to the resistor 102 in the circuit diagram shown in FIG. 1. A harmonic processing circuit 203 corresponds to the harmonic processing circuit 103 in the circuit diagram shown in FIG. 1, and includes a bonding wire 203A and a capacitance pad 203B. An input-side fundamental matching circuit 204 corresponds to the input-side fundamental matching circuit 104 in the circuit diagram shown in FIG. 1, and includes a bonding wire 204A and a capacitance pad 203B. Similarly, an output-side fundamental matching circuit 205 corresponds to the output-side fundamental matching circuit 105 in the circuit diagram shown in FIG. 1, and includes a bonding wire 205A and a capacitance pad 205B.

Although the capacitance pad 203B is shown as discrete components for the respective low-output transistors 201 in FIG. 2, the number of parts may be one by patterning a plurality of conductors on a ceramic substrate. Although the harmonic processing circuit 203 is shown only as a processing circuit for a single harmonic, the harmonic processing circuit 203 may include a circuit which can process a higher order harmonic.

The aforementioned configuration is mounted in a single package, and a signal is readout to an outside of the package by connecting the capacitance pad 204B in the input side and the capacitance pad 205B in the output side to respective lead terminals (not shown) via bonding wires (not shown) and the like. Here, the capacitance pad 204B in the input side and the capacitance pad 205B in the output side may be placed outside the package.

In addition, bias is applied from the outside of the package. It is a general configuration to be used for the above that the bias is inputted through a bias line to which a $\lambda/4$ short stub (not shown) is added under the condition that a wavelength of the fundamental is set to $\lambda$. As a performance, the configuration has conductivity for a direct-current component, and the impedance for the fundamental is in the open state. Accordingly, the configuration does not affect on a property of the device even if the bias line is formed.

The low-output transistor 201 includes a gate 206, a drain 207, and a source 208. The source 208 is grounded by a via hole 209. The drain 207 which serves as an output terminal of the low-output transistor 201 is connected to another drain 207 by the resistor 202. The low-output transistor 201 which includes the gate 206, the drain 207, the source 208, and the via hole 209, and the resistor 202 are formed on a single chip 210, thereby simplifying a process.

The low-output transistor 201 is shaped in a double-gate type in which the gate width Wg is 400 µm, and an output is at a level of 2 W, for example. According to the specifications of the low-output transistor 201, the radio frequency amplifier according to Embodiment 1 of the present invention can achieve the high output at a level of 100 W class by connecting 45 low-output transistors 201 in parallel. At this time, a total gate width of the obtained transistor including 45 low-output transistors 201 connected in parallel is 36 mm (400 µm×2×45). Accordingly, a size of a chip is at a level of 4.5 mm long by 0.7 mm wide.

In the layout shown in FIG. 2, the gate 206 is arranged between each of the finger-shaped sources 208 aligned in a width direction and each of the finger-shaped drains 207 aligned in a width direction.

The gate 206 of the low-output transistor 201 is connected to the bonding wire 204A of the input-side fundamental matching circuit 204.

The drain 207 in the low-output transistor 201 connected to the harmonic processing circuits 203.

The harmonic processing circuit 203 is provided for each of the low-output transistors 201.

The resistor 202 is formed between connection parts each of which connects the drain 207 of the low-output transistor 201 with an output pad 207A.

As described above, the low-output transistors 201 are arranged in parallel via the resistor 202, thereby enhancing the isolation between the low-output transistors 201, in comparison with a case where the drain output terminals of the low-output transistors 201 are short-circuited. Accordingly, an output impedance of each of the low-output transistors 201 can be kept at a high level.

The harmonic processing circuit 203 is connected to the drain output terminal of each of the low-output transistor 201, resulting in a difference between the output impedance of the transistor higher than that of the conventional transistor and the low impedance of the harmonic processing circuit 203 which falls in the short-circuited state by the secondary harmonic. The difference allows the harmonic processing circuit to function more effectively, thereby enabling the radio frequency amplifier circuit to operate at high efficiency. If the radio frequency amplifier circuit operates in the inverse class-F, it is only necessary for the radio frequency amplifier circuit to connect a circuit which falls in the short-circuited state at a tertiary harmonic. This can improve the function as a short circuit.

Compared with a case where the drain output terminals of the low-output transistors 201 are not connected to each other, the formation of the unnecessary electric loop which may provoke oscillation can be avoided in the signal paths, such as the low-output transistor 201, the harmonic processing circuit 203, and the output-side fundamental matching circuit 205.

This enables the harmonic processing for the class-F operation or the inverse class-F operation to be operated with high efficiency and stability.

In addition, the impedance of the resistor 202 in the frequency band of the radio frequency signal is preferably higher than the output impedance of each of the low-output transistors 201 connected in parallel not via the resistor 202. If each of the low-output transistors 201 has the size described in the aforementioned example, the output impedance of each of the low-output transistors 201 is at a level of 100Ω at the fundamental frequency 2.45 GHz. In contrast, the output impedance of 50 low-output transistors 201 connected in parallel is approximately 2Ω at the fundamental frequency 2.45 GHz. In this case, the impedance of the resistor 202 is preferably more than or equal to 2Ω, more preferably, from 10Ω to 1 kΩ.

Accordingly, in comparison with the conventional configuration in which the output terminals of the low-output transistors 201 are short-circuited, the isolation between the low-output transistors 201 can be appropriately enhanced.

Although it is assumed that the low-output transistor 201 is a heterojunction field effect transistor (HFET) made of GaN/AlGaN, a material is not limited thereto, and the low-output transistors 201 may be made of Si or GaAs. In addition, a type of the transistor is not limited to a FET or a bipolar transistor.

The bonding wires 203A, 204A, and 205A respectively included in the harmonic processing circuit 203, the input-side fundamental matching circuit 204, and the output-side fundamental matching circuit 205 are not limited to such a lumped parameter element, but may be formed by a distributed constant element. For example, consideration is given to a case where the distributed constant element is used for the harmonic processing circuit 203. In order to create a short circuit for the secondary harmonic as the class-F operation, when the wavelength of the secondary harmonic is set to $\lambda_2$, a length of a distributed constant line may be $\lambda_2/4$, while when the wavelength of the fundamental is expressed by $\lambda$, the distributed constant line may be $\lambda/8$. Likewise, in the case of the inverse class-F operation, when the wavelength of the tertiary harmonic is set to $\lambda_3$, the line length may be $\lambda_3/4$, while when the wavelength of the tertiary harmonic is set to $\lambda$, the line length may be $\lambda/12$. If the distribution constant element is used for the configuration, it is desirable that the harmonic processing circuit 203, the input-side fundamental matching circuit 204, and the output-side fundamental matching circuit 205 are formed on a single chip, in view of a possibility of elimination of a mounting process.

[Embodiment 2]

Figure 3:
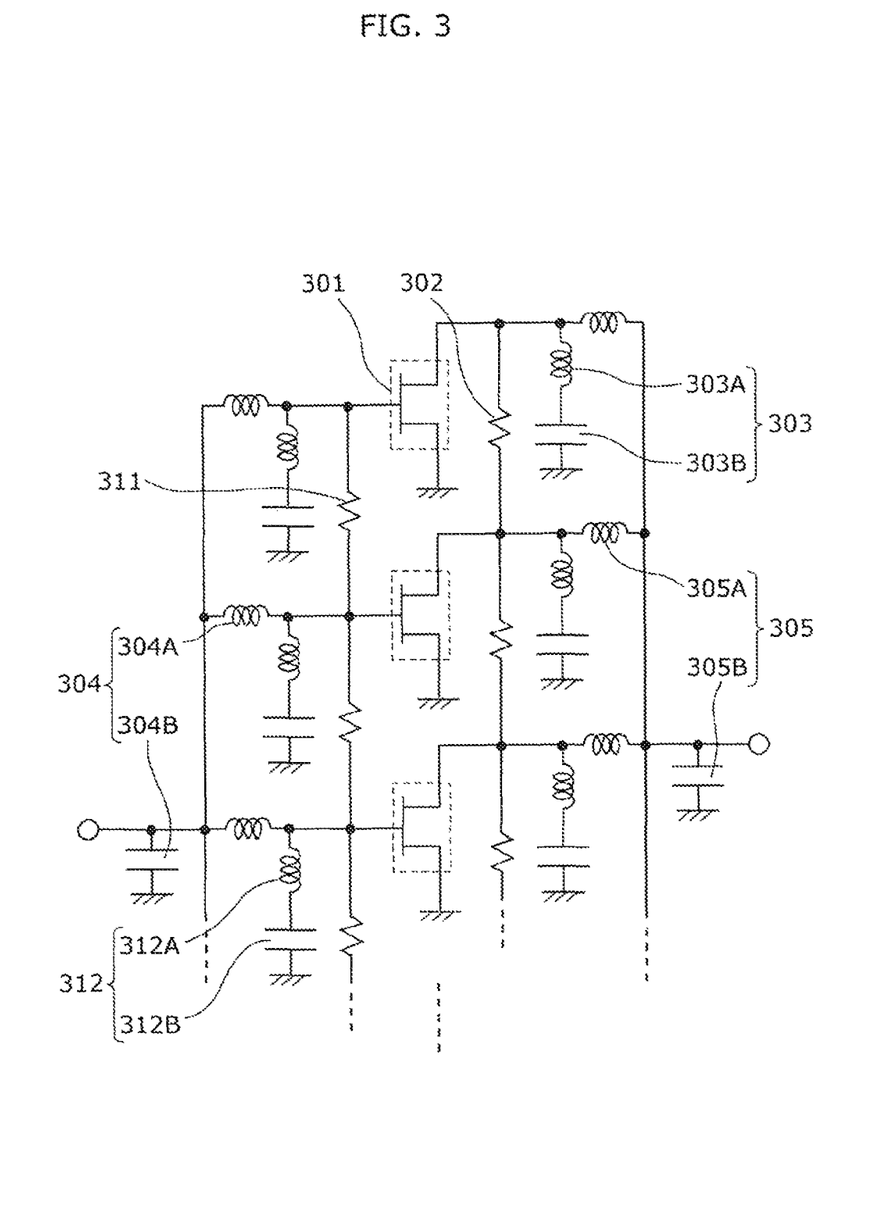
FIG. 3 is a circuit diagram which shows a radio frequency amplifier circuit according to Embodiment 2 of the present invention.

FIG. 3 is a circuit diagram which shows a radio frequency amplifier circuit according to Embodiment 2 of the present invention. The radio frequency amplifier circuit shown in FIG. 3 includes a plurality of low-output transistors 301 connected in parallel, a resistor 302 arranged between drain output terminals of the adjacent low-output transistors 301, a harmonic processing circuit 303 connected to each of the drain output terminals of the low-output transistors 301, an input-side fundamental matching circuit 304, an output-side fundamental matching circuit 305, a resistor 311 arranged between gate input terminals of the adjacent low-output transistors 301, a harmonic processing circuit 312 connected to each of the gate input terminals of the low-output transistors 301.

The radio frequency amplifier circuit shown in FIG. 3 according to Embodiment 2 is different from the radio frequency amplifier circuit shown in FIG. 1 in a point that the resistor 311 and the harmonic processing circuit 312 are also provided in the input side in addition to the output side. Description of a point same with the radio frequency amplifier circuit according to Embodiment 1 is omitted, and a different point is focused on in the following description.

A plurality of harmonic processing circuits 312 are arranged in parallel to each other, and each of which serves as an input-side harmonic processing circuit which can process a secondary harmonic included in a radio frequency signal. Each of the harmonic processing circuits 312 serves as a processing circuit which shows a short-circuited state for the secondary harmonic.

Each of the harmonic processing circuits 312 includes an inductor 312A and a capacitor 312B that are connected in series. The inductor 312A which serves as a third inductor includes one end connected to a gate input terminal of one of the low-output transistors 301, and the other end connected to one end of the capacitor 312B which serves as a third capacitor. The other end of the capacitor 312B is grounded. The inductor 312A and the capacitor 312B constitute a series resonant circuit which resonates at a frequency of the secondary harmonic, and shows the short sate.

Each of the harmonic processing circuits 303 has a configuration same with that of the harmonic processing circuit 103 shown in FIG. 1, and includes an inductor 303A and a capacitor 303B. The inductor 303A and the capacitor 303B constitute a series resonant circuit which resonates at the frequency of the secondary harmonic, and shows the short sate.

The input-side fundamental matching circuit 304 has a configuration same with that of the input-side fundamental matching circuit 104 shown in FIG. 1, and includes an inductor 304A which serves as an input matching element provided for each of the low-output transistors 301, and a capacitor 304B shared by the low-output transistors 301.

The output-side fundamental matching circuit 305 has a configuration same with that of the output-side fundamental matching circuit 105 shown in FIG. 1, and includes an inductor 305A provided for each of the low-output transistors 301, and a capacitor 305B shared by the low-output transistors 301.

A class-F circuit and an inverse class-F circuit are a technique used for controlling a voltage/current waveform of an output. Accordingly, the harmonic processing circuit is typically arranged in the output side. In the configuration of the present invention, however, the harmonic processing is performed both in the input side and the output side, thereby achieving much higher efficiency.

The resistor 311 is an input-side resistor which connects gate input terminals of the low-output transistors 301 to each other. The arrangement of the resistor 311 can enhance isolation between the low-output transistors 301 in comparison with a case where the gate input terminals of the low-output transistors 301 are short-circuited with each other. Accordingly, an input impedance of each of the low-output transistors 301 can be kept at a high level. Compared with a configuration in which the gate input terminals of the low output transistors 301 are not connected with each other, formation of an unnecessary current loop which may provoke oscillation can be avoided in signal paths, such as the low-output transistor 301, the harmonic processing circuit 312, and the input-side fundamental matching circuit 304.

If the low-output transistors 301 are connected in parallel for multiple stages so as to obtain a high-output transistor, the input impedance becomes low like the output impedance. Thus, it is difficult to achieve a high efficiency simply by connecting the harmonic processing circuit 312 to each of the gate input terminals of the low-output transistors 301. As described in Embodiment 1, it is sufficient for the gate input terminals of the low-output transistors 301 to be connected with each other via the resistor 311 for ensuring the isolation between the low-output transistors 301. With this configuration, the harmonic processing circuit 312 having a low impedance and ideally being in the short-circuited state in the secondary harmonic is connected, as the class-F operation, for example, to the low-output transistor 301 having a high input impedance, thereby causing the harmonic processing to be performed more efficiently. As a result, the high efficiency is achieved. The same effect can be obtained for a tertiary harmonic when the inverse class-F' operation is performed.

Figure 4:
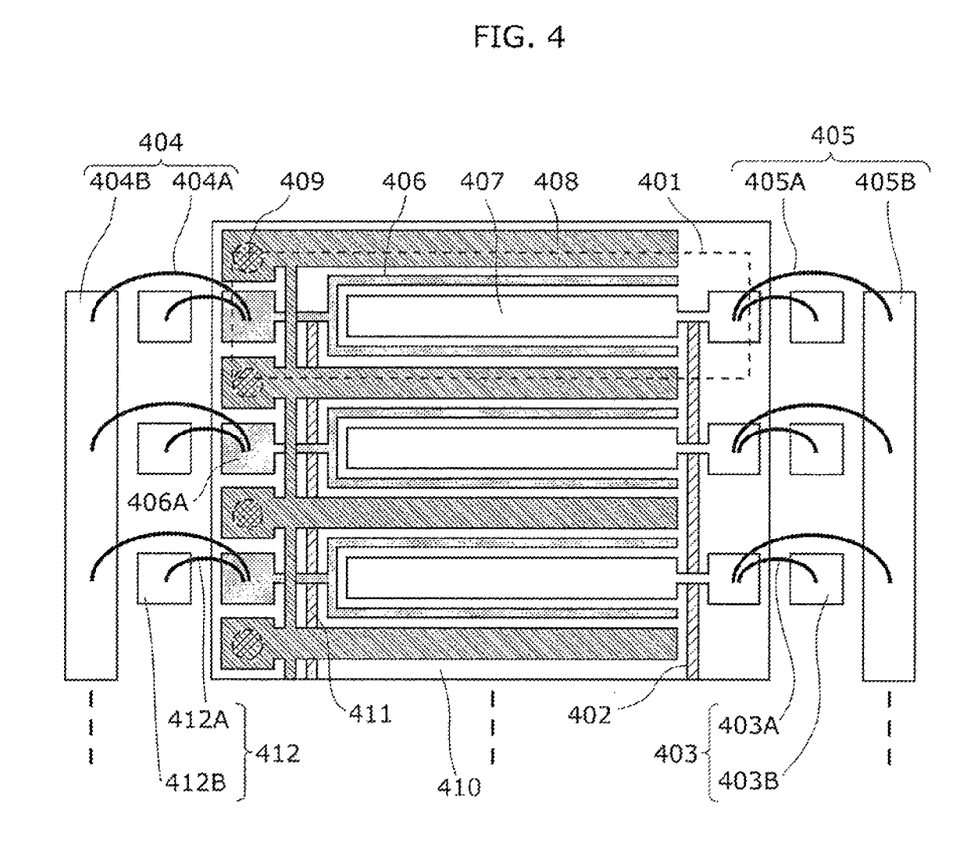
FIG. 4 is a layout which shows the radio frequency amplifier circuit according to Embodiment 2 of the present invention.

FIG. 4 is a layout which shows the radio frequency amplifier circuit according to Embodiment 2 of the present invention. In FIG. 4, an area surrounded by a broken line is a low-output transistor 401 which corresponds to the low-output transistor 301 in the circuit diagram shown in FIG. 3. A resistor 402 corresponds to the resistor 302 in the circuit diagram shown in FIG. 3. A harmonic processing circuit 403 corresponds to the harmonic processing circuit 303 in the circuit diagram shown in FIG. 3, and includes a bonding wire 403A and a capacitance pad 403B. A resistor 411 corresponds to the resistor 311 in the circuit diagram shown in FIG. 3. A harmonic processing circuit 412 corresponds to the harmonic processing circuit 312 in the circuit diagram shown in FIG. 3, and includes a bonding wire 412A and a capacitance pad 412B. An input-side fundamental matching circuit 404 corresponds to the input-side fundamental matching circuit 304 in the circuit diagram shown in FIG. 3, and includes a bonding wire 404A and a capacitance pad 404B. Similarly, an output-side fundamental matching circuit 405 corresponds to the output-side fundamental matching circuit 305 in the circuit diagram shown in FIG. 3, and includes a bonding wire 405A and a capacitance pad 405B.

A gate 406 of each of the low-output transistors 401 is connected to the harmonic processing circuit 412.

The harmonic processing circuit 412 is provided for each of the low-output transistors 401.

The resistor 411 is formed at a connection part between the gate 406 of each of the low-output transistors 401 and the input pad 406A.

Although the capacitance pad 403B is shown as a discrete component for each of the low-output transistors 401 in FIG. 4, the number of parts may be one by patterning a plurality of conductors on a ceramic substrate, for example. Although the harmonic processing circuit 403 is shown only as a processing circuit for a single harmonic, the harmonic processing circuit 403 may include a circuit which can process a high-order harmonic.

The aforementioned configuration is mounted in a single package, and a signal is readout to an outside of the package by connecting the capacitance pad 404B in the input side and the capacitance pad 405B in the output side to respective lead terminals (not shown) via bonding wires (not shown) and the like. However, the capacitance pad 404B in the input side and the capacitance pad 405B in the output side may be placed outside the package.

Each of the low-output transistors 401 includes the gate 406, a drain 407, and a source 408. The source 408 is grounded by a via hole 409. One of the drains 407 which serves as an output terminal of the corresponding one of the low-output transistors 401 is connected to another one of the drains 407 via the resistor 402, and the low-output transistors 401 each of which includes the gate 406, the drain 407, the source 408, and the via hole 409, and the resistor 402 are formed on a single chip 410, thereby simplifying a process.

Although the output-side harmonic processing circuit 403 and the input-side harmonic processing circuit 412 are shown in the same size in FIG. 4, they are not limited thereto. Each of the harmonic processing circuits is a resonant circuit which theoretically falls in the short-circuited state by the secondary harmonic. However, if an optimal impedance is actually calculated, the obtained impedance may be slightly different from the impedance in the short-circuited state. Accordingly, element values in the respective harmonic processing circuits may different from each other.

If the bonding wires 404A and 405A respectively included in the input-side fundamental matching circuit 404 and the output-side fundamental matching circuit 405 are compared with the bonding wires 403A and 412A respectively included in the harmonic processing circuits 403 and 412, the example shows that the former one is longer than the latter one. However, the inverse relationship can be assumed. The number of wires is not limited to one, but a plurality of wires may be formed in parallel.

In a conventional high output transistor, low-output transistors are connected in parallel and output terminals are short-circuited with each other so that the output impedance is significantly reduced. Accordingly, even if a processing circuit which is short-circuited by a harmonic is connected to an output, the processing circuit has difficulty to function as the short circuit for the transistor. As a result, it is difficult to achieve the high efficiency. In contrast, in the configuration of the radio frequency amplifier circuit according to embodiments of the present invention, when a plurality of low-output transistors are connected in parallel to form the high output transistor, the drain output terminals of the low output transistors are connected to each other via the resistor and the gate input terminals of the low-output transistors are connected to each other via the resistor, thereby keeping the input impedance and the output impedance at high level. Accordingly, the impedance of the harmonic processing circuit is sufficiently low for the transistor, thereby enhancing the function as the short circuit of the harmonic processing circuit. As a result, high efficiency can be achieved.

In comparison with a case where the drain output terminals of the low-output transistors are not connected to each other and the gate input terminals of the low-output transistors are not connected to each other, the formation of an unnecessary current loop which may provoke an oscillation can be avoided in the signal paths, such as the input-side fundamental matching circuit 404, the harmonic processing circuit 412, the low-output transistors 401, the harmonic processing circuit 403, and the output-side fundamental matching circuit 405.

This enables the harmonic processing for the class-F operation or the inverse class-F operation with high efficiency and stability.

[Embodiment 3]

Figure 5:
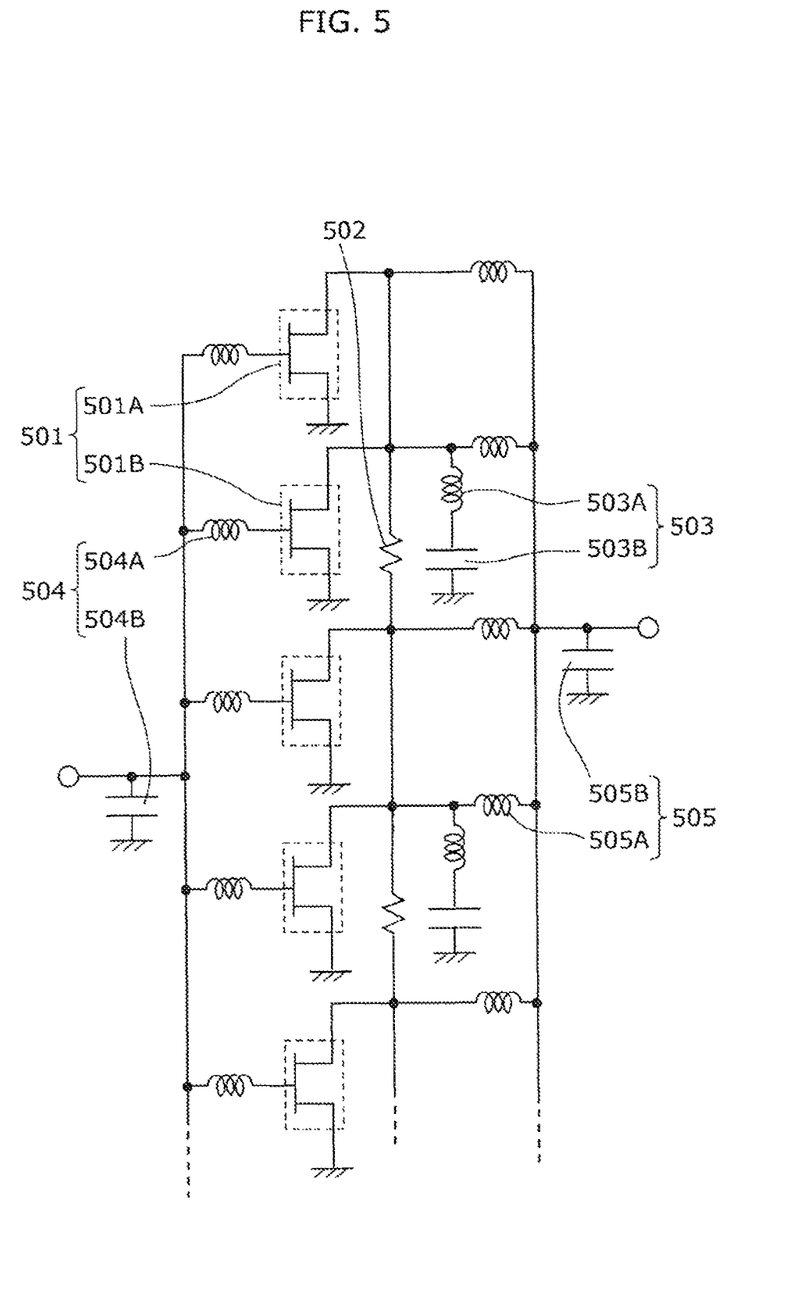
FIG. 5 is a circuit diagram which shows a radio frequency amplifier circuit according to Embodiment 3 of the present invention.

FIG. 5 is a circuit diagram which shows a radio frequency amplifier circuit according to Embodiment 3 of the present invention. The radio frequency amplifier circuit shown in FIG. 5 includes a plurality of low-output transistors 501A and a plurality of low-output transistors 501B both of which are connected in parallel, a resistor 502 arranged between drain output terminals of the low-output transistors 501A and 501B which are adjacent to each other, the harmonic processing circuit 503 connected to each of the drain output terminals of the low-output transistors 501B, the input-side fundamental matching circuit 504, and the output-side fundamental matching circuit 505.

The radio frequency amplifier circuit according to Embodiment 3, which is shown in FIG. 5, is different from the radio frequency amplifier circuit in FIG. 1 in a point that the resistor 502 and the harmonic processing circuit 503 that are arranged in the output side are not connected to each of the low-output transistors, but are connected to every two of the low-output transistors. Description of a point same with that for the radio frequency amplifier circuit according to Embodiment 1 is omitted, and a different point is focused on in the following description.

Each of the low-output transistors 501B which serves as a second transistor includes an input terminal connected to an input terminal of the radio frequency amplifier circuit via an inductor 504A. Each of the low-output transistors 501B includes an output terminal connected to an output terminal of the radio frequency amplifier circuit via an inductor 505A and short-circuited to the output terminal of the adjacent one of the low-output transistors 501A.

Each of the harmonic processing circuits 503 has a configuration same with that of the harmonic processing circuit 103 shown in FIG. 1, and includes an inductor 503A and a capacitor 503B which are connected in series. The inductor 503A and the capacitor 503B constitute a series resonant circuit which resonates at a frequency of the secondary harmonic, and shows the short sate.

The input-side fundamental matching circuit 504 has a configuration same with that of the input-side fundamental matching circuit 104 shown in FIG. 1, and includes an inductor 504A which serves as an input matching element provided for each of the low-output transistors 501A and 501B, and a capacitor 504B shared by the low-output transistors 501A and 501B.

The output-side fundamental matching circuit 505 has the configuration same with that of the output-side fundamental matching circuit 105 shown in FIG. 1, and includes an inductor 505A provided for each of the low-output transistors 501A and 501B, and a capacitor 505B shared by a plurality of the low-output transistors 501A and 501B.

In the radio frequency amplifier circuit according to Embodiment 3 of the present invention, each of the low-output transistors 501A which serves as a first transistor and each of the low-output transistors 501B which serves as a second transistor are arranged in parallel. Accordingly, an output impedance of a transistor 501 in which the transistors 501A and 501B are arranged in parallel and synthesized becomes half of that obtained by a single low-output transistor 501A or 501B. Accordingly the efficiency-improvement effect decreases in this case in comparison with a case where each of the low-output transistor 501A or 501B is connected to a resistor. However, it may be difficult to arrange the resistor 502 for each of the low-output transistors 501A and 501B depending on a size of each low-output transistor. In this case, it is possible to connect the resistor 502 to a set including two low-output transistors, such as one low-output transistor 501A and one low-output transistor 501B, which are connected in parallel, like Embodiment 3 of the present invention.

Figure 6:
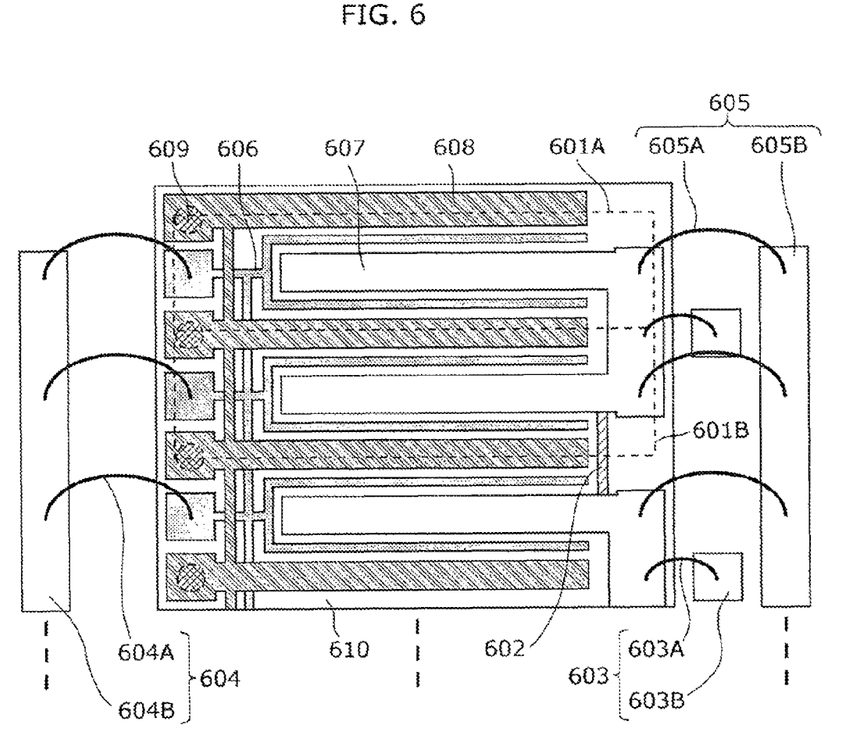
FIG. 6 is a layout which shows the radio frequency amplifier circuit according to Embodiment 3 of the present invention.

FIG. 6 is a layout which shows the radio frequency amplifier circuit according to Embodiment 3 of the present invention. In FIG. 3, areas surrounded by a broken line are respective low-output transistors 601A and 601B, which respectively correspond to the low-output transistors 501A and 501B in the circuit diagram shown in FIG. 5. A resistor 602 corresponds to the resistor 602 in the circuit diagram shown in FIG. 5. A harmonic processing circuit 603 corresponds to the harmonic processing circuit 503 in the circuit diagram shown in FIG. 5, and includes a bonding wire 603A and a capacitance pad 603B. An input-side fundamental matching circuit 604 corresponds to the input-side fundamental matching circuit 504 in the circuit diagram shown in FIG. 5, and includes a bonding wire 604A and a capacitance pad 604B. Similarly, an output-side fundamental matching circuit 605 corresponds to the output-side fundamental matching circuit 505 in the circuit diagram shown in FIG. 5, and includes a bonding wire 605A and a capacitance pad 605B.

Although the capacitance pad 603B is shown as a discrete component for a set of the low-output transistors 601A and 601B in FIG. 6, the number of parts may be one by patterning a plurality of conductors on a ceramic substrate. Although the harmonic processing circuit 603 is shown only as a processing circuit for a single harmonic, the harmonic processing circuit 603 may include a circuit which can process a high-order harmonic.

The aforementioned configuration is mounted in a single package, and a signal is readout to an outside of the package by connecting the capacitance pad 604B in the input side and the capacitance pad 605B in the output side to respective lead terminals (not shown) via bonding wires (not shown) and the like. However, the capacitance pad 604B in the input side and the capacitance pad 605B in the output side may be placed outside the package.

Each of the low-output transistors 601A and 601B includes a gate 606, a drain 607, and a source 608. The source 608 is grounded by a via hole 609. Then, the drain output terminals of the low-output transistors 601A are connected to each other via the resistor 602. The drain output terminals of the low-output transistors 601B are connected to each other via the bonding wire 605A, and short-circuited to an output terminal of the adjacent one of the low-output transistors 601A. The low-output transistors 601A and 601B, and the resistor 602 are formed in a single chip 610, thereby simplifying the process.

In the radio frequency amplifier circuit according to Embodiment 3, the efficiency-improvement effect slightly decreases in comparison with a case in which a resistor is connected to each of the low-output transistors, like the radio frequency amplifier circuits according to Embodiments 1 and 2. However, it is obvious that the radio frequency amplifier circuit according to Embodiment 3 is more advantageous in the efficiency improvement than a case in which a plurality of low-output transistors are connected with no resistor, like the conventional technique.

Although in Embodiment 3, a circuit configuration is exemplified, as an example, in which the inductor 504A is connected for each of the gate input terminals of the low-output transistors 501A and 501B, while the inductor 505A is connected to each of the drain output terminals of the low-output transistors 501A and 501B, the inductors 504A and 505A for matching are not necessarily required to be arranged for each of the low-output transistors. In the layout of the radio frequency amplifier circuit shown in FIG. 6, for example, the bonding wire 604A may be arranged for each of a set of the low-output transistors 601A and 601B from the short-circuited wired area in which a gate input pad of each of the low-output transistors 601A and a gate input pad of each of the low-output transistors 601B are short-circuited via a wire on the chip 610, to the capacitance pad 604B. Here, the gate input pads of the low-output transistors 601A and 601B are formed on the chip 610. Furthermore, the bonding wire 605A may be arranged for each set of the low-output transistors 601A and 601B from a short-circuited part between the drain output pad of each of the low-output transistors 601A and the drain output pad of each of the low-output transistors 601B to the capacitance pad 605B. The both drain output pads are formed on the chip 610.

An analogous circuit of the radio frequency amplifier circuit configured as above is formed in such a manner that in the circuit diagram shown in FIG. 5, the gate input terminals of a set of the low-output transistors 501A and 501B are short-circuited to each other, and the inductor 504A is connected in series between the short-circuited shared gate input terminal and the input terminal of the radio frequency amplifier circuit. The inductor 505A is not connected to, in series, each of the drain output terminals of the low-output transistors 501A and 501B, but connected in series between the shared drain output terminal of the short-circuited low-output transistors 501A and 501B, and the output terminal of the radio frequency amplifier circuit.

The radio frequency amplifier circuit having the aforementioned circuit configuration is included in the present invention, and yields a similar effect as that in the radio frequency amplifier circuit according to Embodiment 3.

The resistor 502 is connected to each of the parallel-combined transistor 501 which includes two low-output transistors 501A and 501B, as an example, in the Embodiment 3. However, the efficiency-improvement effect can be obtained by the same technical concept, even if the number of the transistors to be parallel-synthesized increases, like a transistor in which three low-output transistors are parallel-synthesized, or a transistor in which four low-output transistors are parallel-synthesized. Even if the resistor is arranged in the input side as in the radio frequency amplifier circuit described in Embodiment 2, a resistor may be connected for each of a transistor in which some low-output transistors are synthesized in parallel.

The radio frequency amplifier circuit of the present invention is described in the above, based on the aforementioned embodiments. The present invention is, however, not limited to the embodiments. Possible variations which include changes added by a person skilled in the art in his/her conceivable range may be involved in the present invention as long as the variations are not depart from the principles of the present invention Each structural component in the embodiments may be arbitrarily combined without departing from the principles of the present invention.

It should be noted that the resistor connected to the gate input terminal and the drain output terminal, of each of the low-output transistors may not be a resistor element as a circuit part, and a resistive area formed by patterning a resist material on a chip may be used as the resistor.

INDUSTRIAL APPLICABILITY

A radio frequency amplifier circuit according to the present invention can be used as a high-output power amplifier applicable to a terminal and a base station for a mobile communication, as well as to a home electrical appliance using microwave, such as a microwave oven.

REFERENCE SIGNS LIST 101, 201, 301, 401, 501A, 501B, 601A, 601B Low-output transistor
102, 202, 302, 311, 402, 411, 502, 602 Resistor
103, 203, 303, 312, 403, 412, 503, 603 Harmonic processing circuit
103A, 104A, 105A, 303A, 304A, 305A, 312A, 503A, 504A, 505A, 702A, 703A, 703B Inductor
103B, 104B, 105B, 303B, 304B, 305B, 312B, 503B, 504B, 505B, 702B, 703C Capacitor
104, 204, 304, 404, 504, 604 Input-side fundamental matching circuit
105, 205, 305, 405, 505, 605 Output-side fundamental matching circuit
203A, 204A, 205A, 403A, 404A, 405A, 412A, 603A, 604A, 605A, Bonding wire
203B, 204B, 205B, 403B, 404B, 405B, 412B, 603B, 604B, 605B, Capacitance pad
206, 406, 606 Gate
207, 407, 607 Drain
207A Output pad
208, 408, 608 Source
209, 409, 609, Via hole
210, 410, 610 Chip
406A Input pad
501, 701 Transistor
702 Secondary harmonic processing circuit
703 Fundamental matching circuit
704 Dielectric substrate
705 External circuit

The invention claimed is:

1. A radio frequency amplifier circuit comprising:
a plurality of first transistors, each of which includes an input terminal, an output terminal, and a ground terminal, and amplifies a radio frequency signal;
an output-side harmonic processing circuit provided for each of the first transistors to be connected to the output terminal of the first transistor, the output-side harmonic processing circuit processing even harmonics or odd harmonics both included in the amplified radio frequency signal, thereby operating in a class-F mode or an inverse class-F mode; and
an output-side resistor connected to the output terminal of each of the first transistors,
wherein the input terminal of each of the first transistors is connected to an input terminal of the radio frequency amplifier circuit via an input matching element, and
the output terminal of each of the first transistors is connected to the output terminal of the other one of the first transistors via the output-side resistor, and is further connected to an output terminal of the radio frequency amplifier circuit via an output matching element.

2. The radio frequency amplifier circuit according to claim 1,
wherein an impedance of each of output-side resistors which include the output-side resistor in a frequency band of the radio frequency signal is higher than a real part of an output impedance of each of the first transistors which are connected in parallel to each other not via the output-side resistor.

3. The radio frequency amplifier circuit according to claim 1,
wherein each of output-side harmonic processing circuits which include the output-side harmonic processing circuit includes:
a first inductor which has a first end connected to the output terminal of the first transistor: and
a first capacitor which has a first end connected to a second end of the first inductor, and a second end grounded, and
the output-side harmonic processing circuit is a series resonant circuit which resonates at a frequency twice as high as a fundamental frequency of each of the first transistors.

4. The radio frequency amplifier circuit according to claim 1, further comprising
an output-side fundamental matching circuit connected to the output terminal of the first transistor and the output-side harmonic processing circuit, the output-side fundamental matching circuit selectively passing a fundamental included in the amplified radio frequency signal,
wherein the output-side fundamental matching circuit includes:
second inductors, each of which serves as the output matching element, and has a first end connected to the output terminal of the first transistor and a second end connected to the second end of another second inductor; and
a second capacitor which has a first end connected to every second end of the second inductors, and a second end grounded.

5. The radio frequency amplifier circuit according to claim 1,
wherein the first transistors and output-side resistors including the output-side resistor are formed on a single chip, and
output-side harmonic processing circuits including the output-side harmonic processing circuit are mounted inside a package in which the chip is mounted.

6. The radio frequency amplifier circuit according to claim 1, further comprising:
an input-side harmonic processing circuit which is provided for each of the first transistors to be connected to the input terminal of the first transistor, the input-side harmonic processing circuit processing the even harmonics or the odd harmonics both included in the amplified radio frequency signal, thereby operating in the class-F mode or the inverse class-F mode; and
an input-side resistor connected to the input terminal of each of the first transistors,
wherein the input terminal of each of the first transistors is connected to the input terminal of the other one of the first transistors via the input-side resistor.

7. The radio frequency amplifier circuit according to claim 6,
wherein an impedance of each of input-side resistors which include the input-side resistor in a frequency band of the radio frequency signal is higher than an input impedance of each of the first transistors which are connected in parallel to each other.

8. The radio frequency amplifier circuit according to claim 6,
wherein each of input-side harmonic processing circuits which include the input-side harmonic processing circuit includes:
a third inductor which has a first end connected to the input terminal of the first transistor; and
a third capacitor which has a first end connected to a second end of the third inductor, and a second end grounded, and
the input-side harmonic processing circuit is a series resonant circuit which resonates at a frequency twice as high as a fundamental frequency of each of the first transistors.

9. The radio frequency amplifier circuit according to claim 6, further comprising
an input-side fundamental matching circuit connected to the input terminal of the first transistor and the input-side harmonic processing circuit, the input-side fundamental matching circuit selectively passing a fundamental included in the amplified radio frequency signal,
wherein the input-side fundamental matching circuit includes:
fourth inductors, each of which serves as the input matching element, and has a first end connected to the input terminal of the first transistor, and a second end connected to the second end of another fourth inductor; and
a fourth capacitor which has a first end connected to every second end of the fourth inductors, and a second end grounded.

10. The radio frequency amplifier circuit according to claim 6,
wherein input-side resistors including the input-side resistor, the first transistors, and output-side resistors including the output-side resistor are formed on a single chip, and
input-side harmonic processing circuits including the input-side harmonic processing circuit and output-side harmonic processing circuits including the output-side harmonic processing circuit are mounted inside a package in which the chip is mounted.

11. The radio frequency amplifier circuit according to claim 1, further comprising:
- a plurality of second transistors, each of which includes an input terminal, an output terminal, and a ground terminal, and amplifies the harmonic signal,
- wherein the input terminal of each of the second transistors is connected to the input terminal of the radio frequency amplifier circuit via the input matching element, and
- the output terminal of each of the second transistors is connected to the output terminal of the radio frequency amplifier circuit via the output matching element, and is further short-circuited to the output terminal of an adjacent one of the first transistors.

12. The radio frequency amplifier circuit according to claim 11,
- wherein the second transistors, the first transistors, and output-side resistors including the output-side resistor are formed on a single chip, and
- output-side harmonic processing circuits including the output-side harmonic processing circuit are mounted in a package in which a chip is mounted.

* * * * *